United States Patent [19]
Yamazaki

[11] Patent Number: 5,046,140
[45] Date of Patent: Sep. 3, 1991

[54] AUTOMATIC OPTICAL FREQUENCY ACQUISITION AND TRACKING APPARATUS FOR OPTICAL COHERENT COMMUNICATION SYSTEM

[75] Inventor: Shuntaro Yamazaki, Tokyo, Japan

[73] Assignee: NEC Corporation, Tokyo, Japan

[21] Appl. No.: 560,665

[22] Filed: Jul. 31, 1990

[30] Foreign Application Priority Data

Jul. 31, 1989 [JP] Japan .................................. 1-199612

[51] Int. Cl.$^5$ .............................................. H04B 9/00
[52] U.S. Cl. .................................................... 359/191
[58] Field of Search ................ 455/619, 616, 600, 617

[56] References Cited

U.S. PATENT DOCUMENTS 4,903,342  2/1990  Yamazaki ............................ 455/619

OTHER PUBLICATIONS

S. D. Lowney et al., "Frequency Acquisition and Tracking for Optical Heterodyne Communication Systems", *Journal of Lightwave Technology*, vol. LT-5, No. 4, Apr. 1987, pp. 538-550.

*Primary Examiner*—Reinhard J. Eisenzopf
*Assistant Examiner*—Geoff Sutcliffe
*Attorney, Agent, or Firm*—Sughrue, Mion, Zinn, Macpeak & Seas

[57] ABSTRACT

An automatic frequency control system, for an optical coherent communication system, in which an output frequency of a local oscillator is swept by a frequency sweep signal FM-modulated with a frequency shift signal. The FM-modulated local frequency is combined with an input optical signal and heterodyne-detected. A frequency shift signal component derived from a heterodyne detection output is compared with the frequency shift signal to verify whether or not the local oscillation frequency is in a predetermined range with respect to the input signal frequency. When it is in the predetermined range, the system operates to terminate the frequency sweep signal and remove the frequency shift signal and is switched to oscillation frequency control of the local oscillator by using a d.c. component of the hterodyne detection output.

6 Claims, 4 Drawing Sheets

AUTOMATIC OPTICAL FREQUENCY ACQUISITION AND TRACKING APPARATUS FOR OPTICAL COHERENT COMMUNICATION SYSTEM

BACKGROUND OF THE INVENTION

The present invention relates to an optical coherent communication system, and, particularly to a technique for controlling intermediate frequency in an optical heterodyne communication system.

The optical heterodyne communication (optical coherent communication) system is advantageous in that a long distance, high density transmission is possible because reception sensitivity is much higher compared with a direct detection communication system and because frequency utilization efficiency is high.

In a heterodyne detection system, an optical detector receives a composite signal of an input optical signal transmitted from a transmitting portion and a local oscillation light from a local oscillation light source included in an optical signal receiving portion thereof. As a result, a beat corresponding to a frequency difference therebetween appears at an output of the optical detector as an electric intermediate frequency (IF) signal. By demodulating this intermediate frequency signal, a base band signal is obtained. When the relative frequency difference is not maintained constant, fluctuation of the intermediate frequency occurs, resulting in an error in a demodulated signal. Therefore, in the optical heterodyne detection, the intermediate frequency has to be stabilized.

Stabilization of intermediate frequency is disclosed in S. D. Lowney et al., "Frequency Acquisition and Tracking for Optical Heterodyne Communication Systems", Journal of Lightwave Technology, April 1987, pages 538 to 550. In this article, an IF band is divided into a plurality of subbands and a corresponding number of bandpass filters are provided for the respective subbands. An oscillation frequency of a local optical oscillation source is controlled while monitoring outputs of the respective bandpass filters to stabilize intermediate frequency. Since, however, a frequency variation of a light source is much wider than a predetermined intermediate frequency band and thus a large number of such bandpass filters are required, the Lowney et al. system is disadvantageous economically.

In the heterodyne detection system, frequency of local oscillation light is set to a value which is higher or lower than the optical input signal frequency. Assume that the local optical oscillation frequency $f_{LO}$ is set to a value higher than an input optical signal frequency $f_{in}$ for normal operation, i.e., $f_{LO} > f_{in}$. When the optical input signal frequency becomes higher than the local optical oscillation frequency for a reason that the input optical signal frequency is varied remarkably or an oscillation frequency on a transmission side is deviated remarkably from a predetermined value the, intermediate frequency becomes the so-called image band IF. Although a value itself of the image band intermediate frequency is the same as that of a real band intermediate frequency, input frequency vs. output voltage characteristics of a frequency discriminator circuit used for automatic frequency control (AFC) must be reversed for the image and real band IF's. Therefore, when the intermediate frequency is within the image band, the AFC can not operate normally and becomes unstable.

This phenonmenon will be described in more detail with reference to FIGS. 1A and 1B.

FIG. 1A shows a case where the intermediate frequency spectrum is within a real band ($f_{LO} > f_{in}$), in which a curve 40 is an input intermediate frequency ($f_{LO} - f_{in}$) vs. output voltage characteristic of a frequency discriminator circuit. In this case, when an input IF spectrum 41 is shifted rightwardly from the shown position, a d.c. component of the frequency discriminator circuit output becomes positive. A stabilization of the intermediate frequency is obtained by controlling a frequency of the local optical oscillation source such that it is lowered when the d.c. component of the frequency discriminator output becomes positive and increased when the output becomes negative.

On the contrary, when the intermediate frequency spectrum is within the image band ($f_{LO} < f_{in}$), such control produces a problem to be described. FIG. 1B shows a case where the intermediate frequency spectrum is within the image band in which a curve 40' shows an input intermediate frequency ($f_{LO} - f_{in}$) vs. Output voltage characteristic of the frequency discriminator circuit. In this case, when the input IF spectrum 41' is shifted leftwardly from the shown position, a d.c. component of an output of the frequency discriminator circuit becomes positive and so the oscillation frequency of the optical local oscillator is lowered. However, with such reduction of the optical local oscillation frequency, the IF spectrum is further shifted leftwardly, eventually causing the IF spectrum to become out of the operation range of the frequency discriminator circuit. That is, the AFC is stabilized so long as the intermediate frequency is within the real band while it becomes highly unstable when it is within the image band.

The Lowney et al. method mentioned previously is based on an assumption that intermediate frequency is within a real band. Therefore, it is impossible to solve the problem occurring when the intermediate frequency is within the image band.

SUMMARY OF THE INVENTION

An object of the present invention is to provide an automatic optical frequency aquisition and tracking apparatus for optical coherent communication system by which intermediate frequency shifts into the image band are prevented and the intermediate frequency is reliably shifted to an operationally stable point of an automatic frequency control.

According to this invention, there is provided an automatic optical frequency aquisition and tracking apparatus for optical coherent communication systems, which comprises:

local optical oscillation means for producing a local oscillation light;

intermediate frequency band signal producing means responsive to an optical input signal and the local oscillation light to produce an intermediate frequency band signal;

frequency discrimination means for frequency-discriminating the intermediate frequency band signal;

switch means responsive to a control signal to allow a d.c. component of an output of the frequency discrimination means to pass through;

frequency sweep means responsive to the control signal to produce a frequency sweep signal for sweeping an oscillation frequency of the local optical oscillation means;

oscillation means responsive to the control signal to produce a frequency deviation signal for causing the oscillation frequency of the local optical oscillation means to be deviated periodically;

oscillation frequency control means responsive to outputs of the switch means, the frequency sweep means and the oscillation means to control the oscillation frequency of the local optical oscillation means; and control means for phase-comparing frequency components of the outputs of the oscillation means and the frequency discrimination means which correspond to the frequency shift signal to determine whether or not the oscillation frequency of the local optical oscillation means is within a predetermined range and for producing the control signal causing the switch means to be closed, to interrupt a frequency sweep operation of the frequency sweep means, and to terminate the frequency shift signal to the oscillation means, when the oscillation frequency is within the predetermined range, and causing the switch means to be opened to terminate the d.c. component, the frequency sweep means to sweep the frequency and the oscillation means to output the frequency shift signal, when the oscillation frequency is out of the predetermined range.

In the present invention, when an FM modulation of small amplitude, which is added during sweeping of the intermediate frequency is demodulated by the frequency, discrimination means, a phase of the resultant signal is inverted according to whether or not the IF signal is within the image band. Therefore, by comparing, in phase, the output of the oscillation means for frequency-modulating the local optical oscillation with the demodulated signal, it is possible to locate the frequency sweep of the IF signal at a predetermined stable point outside of the image band.

BRIEF DESCRIPTION OF THE DRAWINGS

FIGS. 3A, 3B and 3C illustrate an operation of the present invention in a sweep mode, in which FIG. 3A shows an output waveform of a sweep circuit 14, FIG. 3B shows an output waveform of an oscillator circuit 10 and FIG. 3C shows an oscillation frequency of a local oscillation light source (LO);

DESCRIPTION OF THE PREFERRED EMBODIMENTS

A construction and an operation of a preferred embodiment of the present invention will be described first with reference to FIGS. 2, 3A, 3B, 3C, and 4.

Figure 2:
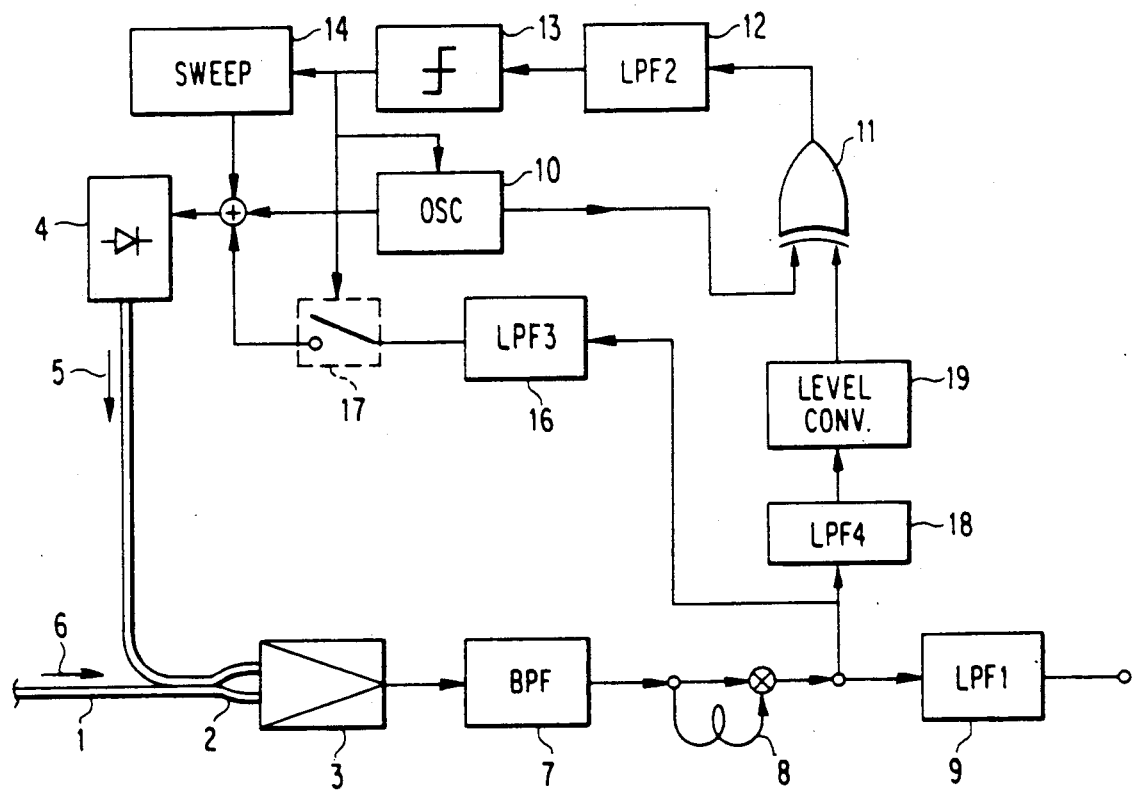
FIG. 2 is a block diagram of a preferred embodiment of the present invention.
Figure 3A:
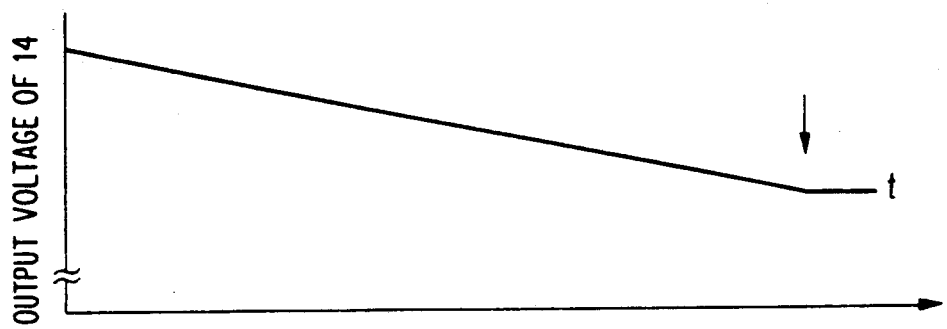
Figure 3B:
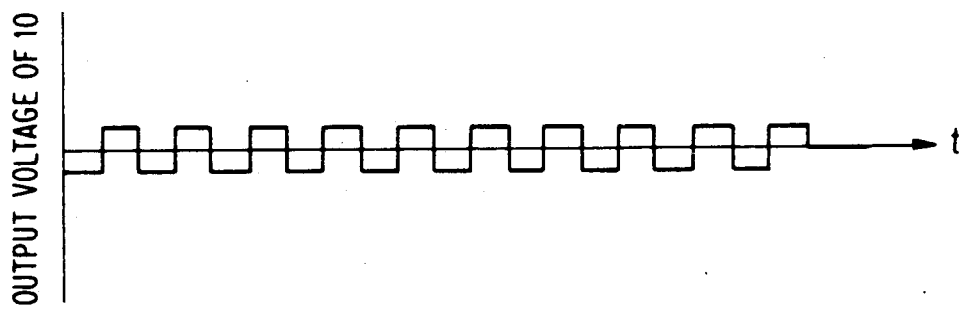
Figure 3C:
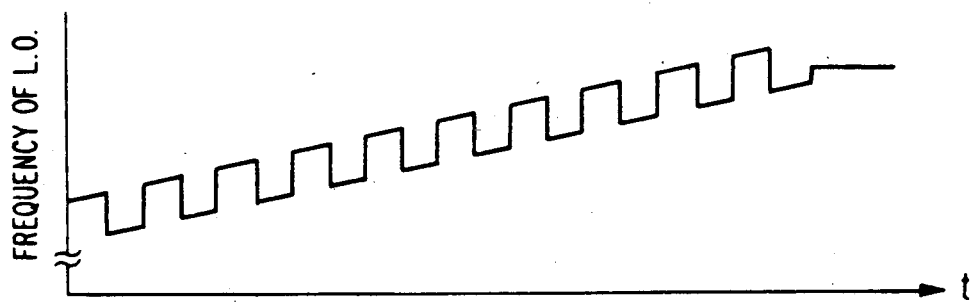

FIG. 2 is a block diagram showing an embodiment of the present invention when applied to a 2.5 G bit/s FSK optical heterodyne receiver and FIG. 3A to 3C illustrate a sweep mode operation of the circuit in FIG. 2. In this embodiment, a binary FSK modulation light having a frequency shift of 2 GHz, for example, is received as an input optical signal 6.

In FIG. 2, a sweep circuit 14 and an oscillator 10 receive a control signal from a level discrimination circuit 13 and produce a frequency sweep signal and a frequency shift signal, respectively. These two signals are added in an adder 15 to an output of a switch 17 and a resultant signal is supplied to a local oscillation light source 4 as an oscillation frequency control signal. The local oscillation light source 4 responds to the oscillation frequency control signal to output a local oscillation light 5. The local oscillation light 5 is combined by an optical coupler 2 with the input optical signal 6. The combined light is supplied to a balanced receiver 3 which produces a beat component of the input optical signal 6 and the local oscillation light 5 as an IF band signal. The IF band signal is filtered by a bandpass filter 7 having a passband of 1.5 GHz to 8.5 GHz to remove its off-band components and then supplied to a frequency discriminator circuit 8 to obtain a baseband signal. An information component of the baseband signal is derived by a first low-pass filter 9. In addition, the baseband signal is supplied to a third low-pass filter 16 and a fourth low-pass filter 18. The third low-pass filter 16 serves to derive only a d.c. component of the baseband signal and supply it to a switch 17. The fourth low-pass filter 18 derives a frequency component of the baseband signal which corresponds to the frequency shift signal from the oscillator 10 and supplies it to a level converter 19. The level converter 19 converts the input signal into a TTL level which is supplied to one of the inputs of the phase comparator 11. The frequency shift signal from the oscillator 10 is supplied to the other input of the phase comparator 11. A second low-pass filter 12 derives from the output of the phase comparator 11 a d.c. component which is supplied to a discrimination circuit 13. The discrimination circuit 13 produces a control signal for controlling operations of the sweep circuit 14 and the oscillation circuit 10. The switch 17 is also controlled by this control signal.

An operation of the present invention in a locked mode where the intermediate frequency is within a real band will be described. In the locked mode, the switch 17 shown in FIG. 2 is closed and the oscillation circuit 10 does not operate. Further, the sweep circuit 14 also does not operate to sweep as to be described. Therefore, the local oscillation light source 4 receives through the adder 15 a voltage which is a sum of d.c. voltages from the third low-pass filter 16 and the sweep circuit 14 and oscillates at an oscillation frequency which sets the beat at a center operating frequency (in this example, 5 GHz) of the frequency discriminator 8. In this operation mode, the voltage which is the sum of d.c. voltages from the sweep circuit 14 and the output of the switch 17 serves as the oscillation frequency control signal.

The input optical signal 6 supplied through an optical fiber 1 is combined by the optical coupler 2 with the local oscillation light from the local oscillation light source 4. The local oscillation light source 4 includes a distributed feedback laser diode (DFB-LD) as its light source. The DFB-LD has characteristics such that, with an increase of a bias current by 1 mA, oscillation frequency is reduced by 1 GHz. The local oscillation light source 4 converts the oscillation frequency control signal supplied thereto into a bias current and supplies the latter to the DFB laser diode to control the oscillation frequency.

Figure 1A:
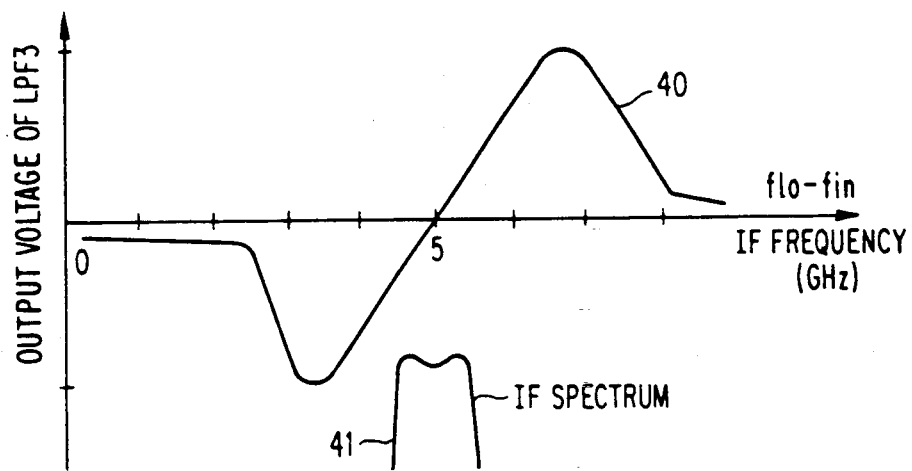
FIGS. 1A and 1B illustrate input intermediate frequency vs. output voltage characteristics of a frequency discriminator.

An input frequency vs. output voltage characteristic of the frequency discriminator circuit 8 is shown in FIG. 1A which has a zero-crossing point at 5 GHz. For higher than 5 GHz, it provides a positive voltage and, for frequencies lower than 5 GHz, it provides a negative voltage. An output of the frequency discriminator circuit 8 is filtered by the third low-pass filter 16 to derive its d.c. component and the latter is supplied through the switch 17 and the adder 15 to the local oscillation light source 4 as the oscillation frequency control signal. In detail, when the output of the third low-pass filter 16 is a positive voltage, the bias current to the DFB-LD of the local oscillation light source 4 is increased to lower the oscillation frequency, and, when the output is a negative voltage, the oscillation frequency of the local oscillation light source 4 is increased. In the locked mode, the intermediate frequency is stabilized in this manner.

A sweep mode operation is shifting the intermediate frequency to the real band will be described. In this operation mode, the switch 17 is open, so that the output of the third low-pass filter 16 is not supplied to the adder 15. The sweep circuit 14 produces a frequency sweep signal such as shown in FIG. 3A in order to sweep the oscillation frequency of the local oscillation light source 4 up to the maximum frequency of 50 GHz. This sweep signal is supplied through the adder 15 to the local oscillation light source 4.

On the other hand, the oscillation circuit 10 produces a square wave of 200 Hz such as shown in FIG. 3B. The 200 Hz square wave is supplied through the adder 15 to the local oscillation light source 4. The square wave is converted in the local oscillation light source 4 into a current variation in the form of square wave having an amplitude of 0.5 mA to FM modulate the local oscillation 5 with a frequency shift amount of 500 MHz. Thus, a frequency variation as shown in FIG. 3C is given to the local oscillation light 5. As mentioned previously, the local oscillation light 5 and the input optical signal 6 are combined in the optical coupler 2. From the resultant signal, the beat component thereof is derived by the balanced receiver 3 and outputted as the IF signal. When the IF signal enters into the passband of the bandpass filter 7, the frequency discriminator circuit 8 provides a signal which is a composite signal of a data signal of 2.5 G bit/s and the 200 Hz square wave. The 200 Hz square wave component is outputted from the frequency discriminator circuit as a signal which is in phase with the output of the oscillator 10 when the IF signal is within the image band and as an inverse phase when the IF signal is within the real band. The reason for this will be described below.

Suppose that the IF is within the real band, that is, frequency $f_{LO}$ of the local oscillation light is higher than the input light frequency $f_{in}$, the intermediate frequency which is the output of the bandpass filter 7 is $f_{LO}-f_{in}$. When this intermediate frequency passes through the frequency discriminator circuit 8, a low frequency portion of the frequency variation of the square wave shown in FIG. 3C is outputted as a low voltage and a high frequency portion is outputted as a high voltage. It should be noted that the phase is opposite to that of the output of the oscillator 10.

On the other hand, when the intermediate frequency is within the image band, the local oscillation light frequency shown in FIG. 3C is lower than the input optical signal frequency. Thus, the intermediate frequency outputted from the bandpass filter 7 becomes $f_{in}-f_{LO}$. When this intermediate frequency passes through the frequency discriminator circuit 8, the high frequency portion of the square wave shown in FIG. 3C is converted into a lower voltage and the lower frequency portion is converted into a higher voltage. It should be noted that this phase is in phase with the output of the oscillator 10.

Thus, the phase of the square wave component of 200 Hz inputted from the oscillator 10 becomes opposite at the output of the frequency discriminator circuit 8 dependent upon whether the intermediate frequency is within the real band or the image band.

Returning to FIG. 2, the square wave component of 200 Hz is derived from the output of the frequency discriminator circuit 8 by the fourth low-pass filter 18, converted by the level converter 19 into a TTL level, and supplied to one of the inputs of the phase comparator 11. In this embodiment, the phase comparator is composed of an Exclusive OR circuit. To the other input of the phase comparator 11, the output of the oscillator 10 in TTL level is supplied. An output of the phase comparator 11 is supplied to the second low-pass filter 12 to derive a d.c. component thereof.

Figure 1B:
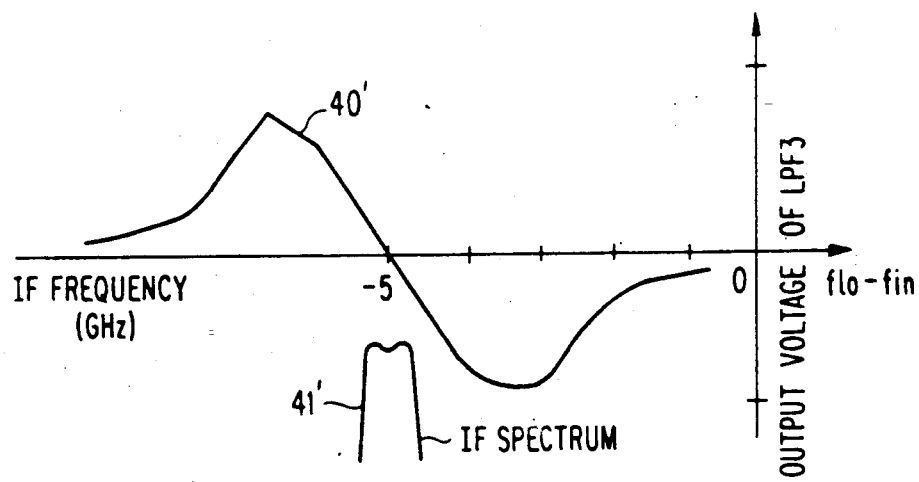

Assuming that the intermediate frequency spectrum is within the image band as shown in FIG. 1B, the output of the second low-pass filter 12 becomes 0 V since square waves of 200 Hz are inputted in phase to the inputs of the phase comparator 11, as described before. When the intermediate frequency spectrum is out of the band of the frequency discriminator 8, the output of the level converter 19 becomes 0 V and, therefore, the square wave of 200 Hz which is the output of the oscillator 10 appears at the output of the phase comparator 11 as is. The square wave of 200 Hz is converted by the second low-pass filter 12 into a d.c. voltage of about 2.5 V. Further, when the intermediate frequency spectrum is within the band of the frequency discriminator 8, which is the real band as shown in FIG. 1A, phases of the outputs of the oscillator 10 and the level converter 19 are reversed to each other and therefore, the output of the second low-pass filter 12 becomes substantially 5 V which is supplied to the discrimination circuit 13.

The discrimination circuit 13 has a fixed threshold value of 3 V. The input voltage to the discrimination circuit 13 exceeds 3 V only when the intermediate frequency spectrum is within the frequency discrimination characteristics in the real band of the frequency discrimination circuit 8. With the input voltage exceeding 3 V, the output of the discrimination circuit 13 becomes high level. Then, the sweep circuit 14 stops to sweep and holds, as its output, the voltage outputted at a time the output of the discrimination circuit 13 is changed from low level to high level (see the time point indicated by an arrow in FIG. 3A). At the same time, the oscillation circuit 10 stops operating and the switch 17 is turned on, so that the circuit shown in FIG. 2 is shifted to the locked mode operation, as described previously. Thus, the intermediate frequency is stabilized.

Figure 4:
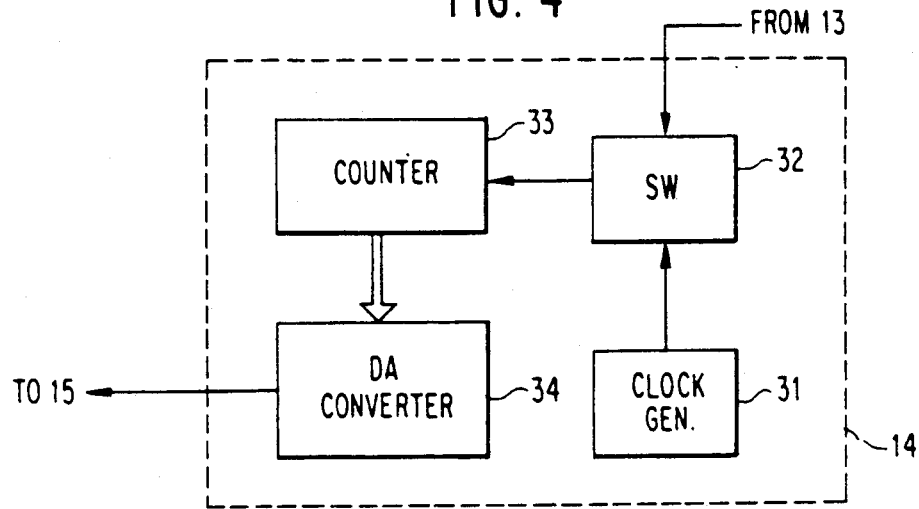
FIG. 4 is a block circuit diagram showing a construction of the sweep circuit 14 to be used in the present invention.

A construction and operation of the sweep circuit 14 to be used in the present invention will be described with reference to FIG. 4. When a low level signal is being supplied from the discrimination circuit 13, a switch 32 passes clock pulses produced by a clock generator 31 to a counter 33. The counter 33 counts the clock pulses and supplies the value shown in FIG. 3A to a DA converter 34. The DA converter 34 converts the supplied count value into an analog signal and supplies it to the adder 15 shown in FIG. 2. Thus, a sweep signal is generated.

On the other hand, when the signal supplied from the discrimination circuit 13 shown in FIG. 2 becomes high level, the switch 32 stops passing the clock pulses to the counter 33, so that the latter stops counting and holds the count value at a time the output of the discrimination circuit 13 is changed from low level to high level. Thus, the sweep circuit 14 provides a constant voltage value in the locked mode.

A second embodiment of the present invention will be described with reference to FIG. 5. A construction of the second embodiment of the present invention is featured by adding to the first embodiment shown in FIG. 2 a function of continuously searching an IF signal. With this function, it becomes possible to make the system ready to receive an optical signal within a short time even if the signal is transmitted as a burst. In the following description, an operation of only the portion added to the first embodiment will be described. An IF signal from the bandpass filter 7 is branched and supplied to a level detector 20. The level detector 20 detects a power level of the IF signal and converts it into a voltage or 0 V to 5 V. The output voltage of the level detector 20 and the output of the discrimination circuit 13 are supplied to an AND circuit 21. When the level of the IF signal is large enough, the "A" port of the AND circuit 21 is high level and so the system operates in the same way as the first embodiment does. When the intermediate frequency becomes out of the passband of the bandpass filter 7 due to termination of the input optical signal 6 or abrupt change of frequency thereof, the port "A" shown in FIG. 5 becomes low level, and thus the output of the AND circuit 21 becomes low level. Further, the switch 17 is opened and the oscillator circuit 10 and the sweep circuit 14 are actuated to start the searching operation for the IF signal. Then, when the optical signal 6 exists within a frequency sweeping range (50 GHz) of the local oscillation 5, the IF pull-in and stabilization is completed within a time (1 second) for which the sweep circuit 14 sweeps an oscillation frequency of the local oscillation 5 once.

In addition to the preferred embodiments described hereinbefore, the present invention can be embodied as to be described.

Figure 5:
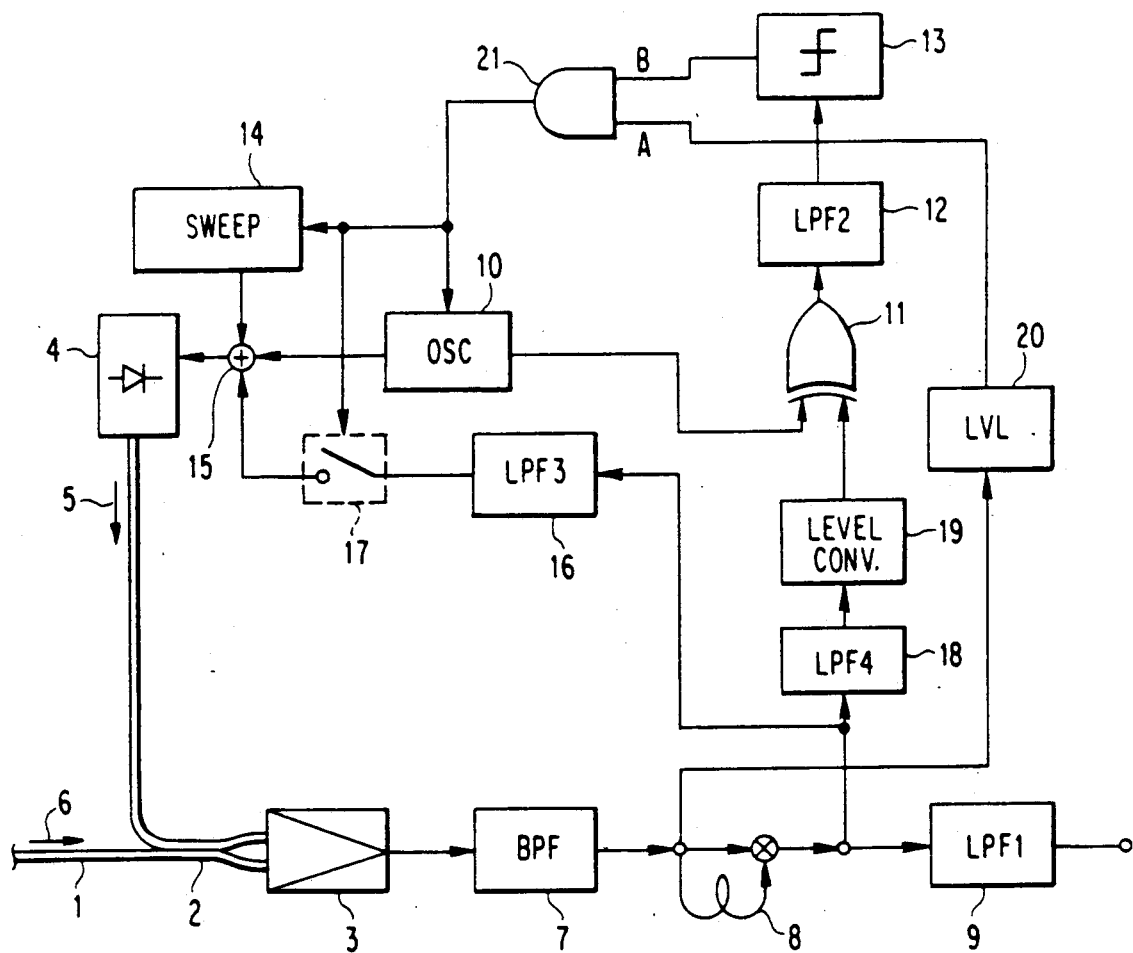
FIG. 5 is a block circuit diagram of another embodiment of the present invention.

That is, although the embodiments shown in FIGS. 2 and 5 are described as applied to an FSK modulation/demodulation system, the present invention is applicable to other modulation/demodulation system by arranging a demodulation system of data signal separately from that shown in FIGS. 2 or 5. Further, although the Exclusive OR circuit is used as the phase comparator in FIGS. 2 or 5, a balanced mixer can be used therefor. Further, as the local oscillator light source, it is possible to use a laser diode whose characteristics is such that with increase of bias current the oscillation frequency is increased. In such cases, a conversion circuit whose characteristic is such that with increase of output voltage of the adder 15 an output current thereof is reduced, may be connected to a biasing current supply terminal of the laser diode. Such laser diode, as mentioned, is disclosed in S. Murata et al., "Tuning Ranges for 1.5 $\mu$m Wavelength Tunable DBR Lasers", vol. 24, No. 10, pp 577 to 579, 1988, Electronics Letters.

In the embodiments shown in FIGS. 2 and 5, the local oscillation frequency is stabilized at a frequency higher than the optical input signal frequency. However, it is possible to stabilize the local oscillation light frequency at a frequency lower than the input signal frequency. In such cases, the frequency discriminator circuit 8 should have a characteristic such that when the input optical signal frequency is higher than the center operating frequency thereof, it causes the oscillation frequency of the local optical oscillation source to increase.

As described hereinbefore, according to the present invention, an automatic optical frequency acquistion and tracking apparatus for an optical coherent communication system is provided, which can pull the intermediate frequency into an operating point of the AFC smoothly.

What is claimed is:

1. An automatic optical frequency acquisition and tracking apparatus for optical coherent communication system, comprising:
    local optical oscillation means for producing a local optical oscillation light;
    intermediate frequency band signal producing means responsive to an optical input signal and the local optical oscillation light to produce an intermediate frequency band signal;
    frequency discrimination means for frequency-discriminating the intermediate frequency band signal;
    switch means responsive to a control signal to allow a d.c. component of an output of said frequency discrimination means to pass through;
    frequency sweep means responsive to the control signal to produce a frequency sweep signal for sweeping an oscillation frequency of said local optical oscillation means;
    oscillation means responsive to the control signal to produce a frequency deviation signal for causing the oscillation frequency of said local optical oscillation means to be deviated periodically;
    oscillation frequency control means responsive to outputs of said switch means, said frequency sweep means and said oscillation means for controlling said oscillation frequency of said local optical oscillation means; and
    control means for phase-comparing frequency components of the outputs of said oscillation means and said frequency discrimination means which correspond to the frequency shift signal to determine whether or not the oscillation frequency of said local optical oscillation means is within a predetermined range and for producing the control signal causing said switch means to be closed to interrupt a frequency sweep operation of said frequency sweep means and to terminate the frequency shift signal to said oscillation means, when the oscillation frequency is within the predetermined range, and causing said switch means to be opened to terminate the d.c. component, said frequency sweep means to sweep the frequency and said oscillation means to output the frequency shift signal, when the oscillation frequency is out of the predetermined frequency range.

2. An automatic optical frequency acquisition and tracking apparatus for optical coherent communication system as claimed in claim 1, further comprising means for monitoring an input level of said frequency discrimination means and for allowing said switch means to pass the input therethrough regardless of said control signal, when the input level is not higher than a predetermined value, to cause said frequency sweep means to sweep the frequency to thereby cause said oscillation means to produce said frequency shift signal.

3. An automatic optical frequency acquisition and tracking apparatus for optical coherent communication systems as claimed in claim 1, wherein said frequency sweep means comprises:

sweep switch means responsive to the control signal to transmit said sweep signal when closed, and a constant signal when open;

a clock generation circuit outputting a plurality of clock pulses;

a counter responsive to said clock generation circuit when said sweep switch means is closed, said counter circuit being incremented by one for every one of said clock pulses outputted by said clock generation circuit; and a digital to analog converter circuit responsive to an output of said counter for generating said sweep signal when said sweep switch is closed and said constant signal when said sweep switch is open.

4. An automatic optical frequency acquisition and tracking apparatus for optical coherent communication systems as claimed in claim 1, wherein said control means comprises:

a first low-pass filter circuit responsive to said output of said frequency discrimination means for producing a frequency component thereof;

level conversion means for converting the frequency component into a TTL signal;

an exclusive-OR circuit responsive to the outputs of said oscillation means and said level conversion means for producing an output accordingly;

a second low-pass filter circuit responsive to the output of said exclusive-OR circuit for producing a D.C. component thereof as an output; and a level discriminator circuit means responsive to the output of said second low-pass filter circuit for producing the control signal.

5. An automatic optical frequency acquisition and tracking apparatus for optical coherent communication systems as claimed in claim 1, further comprising low-pass filter means, responsive to the output of said frequency discrimination means, for producing the D.C. component thereof which is transmitted to said switch means.

6. An automatic optical frequency acquisition and tracking apparatus for optical coherent communication systems as claimed in claim 2, wherein said means for monitoring comprises:

a power level detector for converting said input level of said frequency discrimination means to a TTL signal; and an AND circuit responsive to the control signal and said TTL signal to cause said frequency sweep means to sweep the frequency when said TTL signal is below a predetermined value regardless of the level of said control signal.

* * * * *